United States Patent
Choi et al.

(10) Patent No.: US 8,988,403 B2
(45) Date of Patent: Mar. 24, 2015

(54) DISPLAY APPARATUS AND METHOD OF MANUFACTURING THE SAME

(71) Applicant: Samsung Display Co., Ltd., Yongin, Gyeonggi-do (KR)

(72) Inventors: DaeGuen Choi, Chungcheongnam-do (KR); JinGab Beom, Cheonan-si (KR)

(73) Assignee: Samsung Display Co., Ltd. (KR)

(*) Notice: Subject to any disclaimer, the term of this patent is extended or adjusted under 35 U.S.C. 154(b) by 13 days.

(21) Appl. No.: 13/834,396

(22) Filed: Mar. 15, 2013

(65) Prior Publication Data

US 2014/0048837 A1    Feb. 20, 2014

(30) Foreign Application Priority Data

Aug. 17, 2012   (KR) .......................... 10-2012-0090290

(51) Int. Cl.
*G09G 5/00*    (2006.01)
*H01L 33/62*   (2010.01)
*H01L 27/32*   (2006.01)

(52) U.S. Cl.
CPC ............ *H01L 33/62* (2013.01); *H01L 27/3276* (2013.01); *H01L 27/3288* (2013.01); *H01L 2924/0002* (2013.01)
USPC ................ 345/204; 345/39; 345/98; 345/100

(58) Field of Classification Search
CPC .... G09G 3/14; G09G 2300/0842; G09F 9/33; H01L 33/62
USPC ............................. 345/39–40, 44–46, 80, 82
See application file for complete search history.

(56) References Cited

U.S. PATENT DOCUMENTS

| 7,960,678 | B2 * | 6/2011 | Takahashi et al. | .......... 250/208.2 |
| 8,643,016 | B2 * | 2/2014 | Park et al. | ....................... 257/59 |
| 2009/0169916 | A1 | 7/2009 | Lee et al. | |
| 2010/0201661 | A1 * | 8/2010 | Kimura et al. | ................ 345/205 |
| 2011/0187686 | A1 | 8/2011 | Kim | |

FOREIGN PATENT DOCUMENTS

| KR | 10-0194690 | 2/1999 |
| KR | 10-2009-0070719 | 7/2009 |
| KR | 10-2011-0090627 | 8/2011 |
| KR | 10-2012-0017171 | 2/2012 |

* cited by examiner

*Primary Examiner* — Jennifer Nguyen
(74) *Attorney, Agent, or Firm* — Knobbe Martens Olson & Bear LLP

(57) ABSTRACT

A display device includes a display panel, a driving circuit, and a connection terminal. The display panel includes a display area and a non-display area surrounding the display area and an electrode terminal disposed in the non-display area and extended in a direction. The driving circuit includes a signal terminal extended in the same direction as the electrode terminal and disposed adjacent to the electrode terminal. The connection terminal is disposed on the electrode terminal and the signal terminal to electrically connect the electrode terminal and the signal terminal.

20 Claims, 13 Drawing Sheets

DISPLAY APPARATUS AND METHOD OF MANUFACTURING THE SAME

CROSS-REFERENCE TO RELATED APPLICATIONS

This application claims priority under 35 U.S.C. §119 from Korean Patent Application No. 10-2012-0090290, filed on Aug. 17, 2012, the content of which is herein incorporated by reference in its entirety.

BACKGROUND

1. Field

The present disclosure relates to a display device and a method of manufacturing the same. More particularly, the present disclosure relates to a display device capable of easily coupling a display panel with a circuit substrate, and a method of manufacturing the display device.

2. Description of the Related Technology

A flat panel display device, which has been spotlighted in recent years, includes a driver and a display panel and displays images by controlling the driver to apply image signals to electrode terminals of the display panel. In general, a printed circuit board is used as the driver, and applies the image signals to the electrode terminals to display the images on the display panel. The driver typically employs a chip-on-film or chip-on-glass structure to apply the image signals to the electrode terminals of the display panel.

Recently, in order to display a high-definition image on the flat panel display device, research has been conducted to reduce the size of the electrode terminals and the distance between the electrode terminals. However, since the driver employing the chip-on-film or chip-on-glass structure is manufactured through processes performed under high temperature and pressure conditions, materials in the driver are repeatedly expanded and contracted. Accordingly, the chip-on-film or chip-on-glass structure is not appropriate to reduce the size of the electrode terminals and the distance between the electrode terminals of the driver.

SUMMARY OF CERTAIN INVENTIVE ASPECTS

The present disclosure provides a display device capable of easily coupling a display panel with an external driving circuit while a distance between electrode terminals of the display panel is reduced.

The present disclosure provides a method of manufacturing the display device.

Embodiments of the inventive concept provide a display device which includes a display panel, a driving circuit, and a connection terminal. The display panel includes a display area and a non-display area surrounding the display area and an electrode terminal disposed in the non-display area and extended in a direction. The driving circuit includes a signal terminal extended in the direction of the electrode terminal and disposed adjacent to the electrode terminal. The connection terminal is disposed on the electrode terminal and the signal terminal to electrically connect the electrode terminal and the signal terminal.

The connection terminal includes at least one of indium tin oxide, indium zinc oxide, aluminum zinc oxide, gallium-doped zinc oxide, zinc tin oxide, gallium tin oxide, or fluorine-doped tin oxide. The connection terminal includes at least one of gold, silver, copper, or aluminum.

The display panel further includes a display substrate that includes an insulating substrate and a light emitting diode disposed on a surface of the insulating substrate and a sealer that isolates the light emitting diode from an external environment. The electrode terminal is electrically connected to the light emitting diode and disposed on the surface of the insulating substrate, on which the light emitting diode is disposed.

The driving circuit further includes a base film, and the signal terminal is disposed on the base film.

The display device further includes a protective film is attached to a surface opposite to a surface on which the electrode terminal is mounted of the insulating substrate and to a surface opposite to a surface on which the signal terminal is mounted of the base film, to prevent the connection terminal from being disconnected due to a separation between the display panel and the driving circuit from each other.

The display device further includes a cover covers the connection terminal and a portion of the electrode terminal and the signal terminal, which are disposed at both sides of the connection terminal, to prevent the connection terminal from being exposed to moisture or oxygen in the external environment. The cover includes a light-curing resin or a thermal-curing resin.

Embodiments of the inventive concept provide a display device which includes a display panel, a driving circuit, and a connection terminal. The display panel includes an insulating substrate, a light emitting diode disposed in a display area of the insulating substrate, and an electrode terminal disposed in a non-display area of the insulating substrate and extended in a direction. The driving circuit includes a base film and a signal terminal disposed on the base film, and the signal terminal is extended in the direction of the electrode terminal and disposed adjacent to the electrode terminal. The connection terminal is disposed on the electrode terminal and the signal terminal to electrically connect the electrode terminal and the signal terminal.

Embodiments of the inventive concept provide a method of manufacturing a display device which includes preparing a display panel that includes an insulating substrate, a light emitting diode disposed in a display area of the insulating substrate, and an electrode terminal disposed in a non-display area of the insulating substrate and extended in a direction, preparing a driving circuit that includes a base film and a signal terminal disposed on the base film and extended in the direction of the electrode terminal and disposed adjacent to the electrode terminal, and forming a connection terminal on the electrode terminal and the signal terminal to electrically connect the electrode terminal and the signal terminal.

The connection terminal is formed by forming a conductive ink pattern or a conductive paste pattern on the electrode terminal and the signal terminal in an area in which the display panel and the driving circuit are adjacent to each other using an inkjet print.

The forming of the connection terminal includes coating a conductive ink or a conductive paste to overlap with an area in which the display panel and the driving circuit are adjacent to each other to form a conductive layer, forming a photoresist pattern corresponding to a shape of the electrode terminal and the signal terminal on the conductive layer, and patterning the conductive layer using the photoresist pattern as a mask.

According to the above, the display device includes the connection terminal to electrically connect the electrode terminal of the display panel and the signal terminal of the driving circuit. Thus, although a pitch of the electrode terminal is reduced, the electrode terminal and the signal terminal may be effectively connected to each other.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF CERTAIN INVENTIVE EMBODIMENTS

Figure 1A:
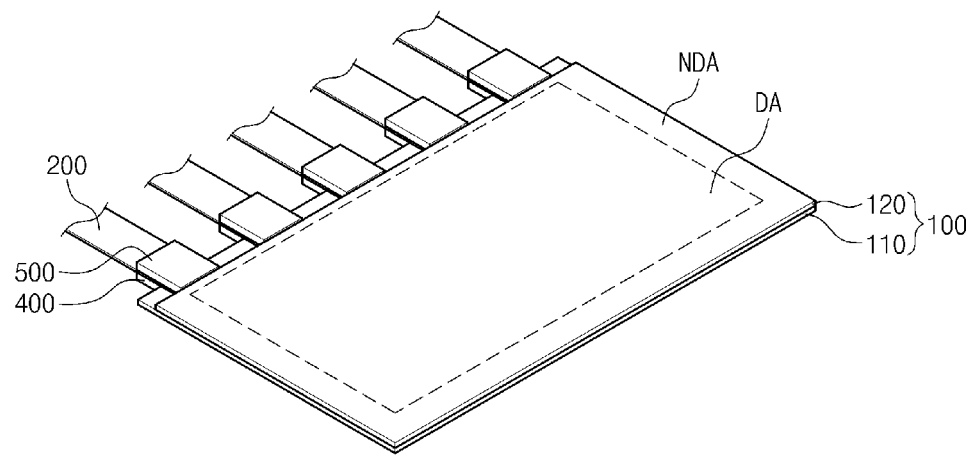
FIG. 1A is a perspective view showing a display device according to an embodiment of the present invention.

It will be understood that when an element or layer is referred to as being "on", "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1B:
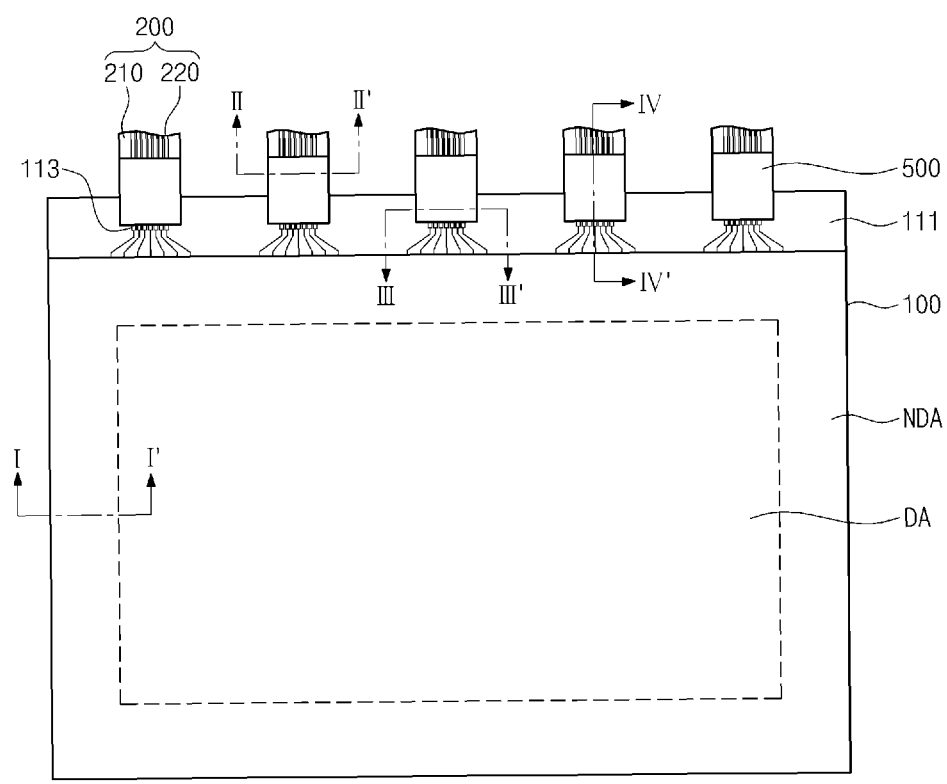
FIG. 1B is a plan view showing the display device shown in FIG. 1A.
Figure 1C:
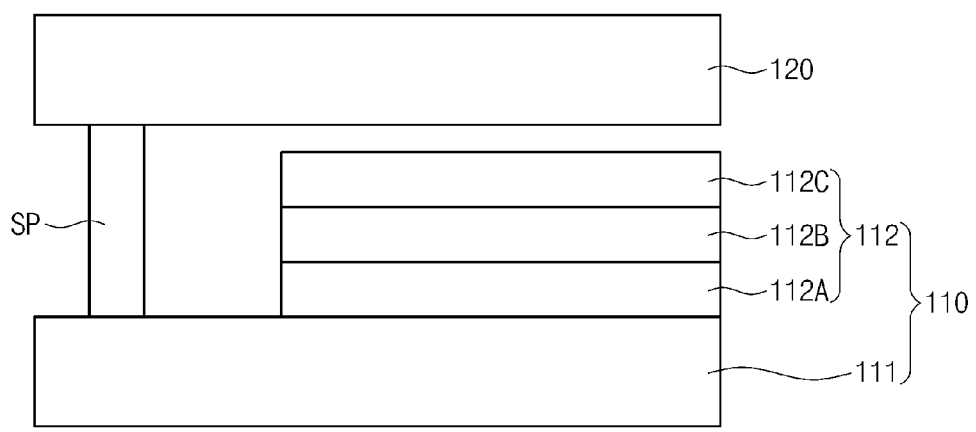
FIG. 1C is a cross-sectional view taken along a line I-I' of FIG. 1B.
Figure 1D:
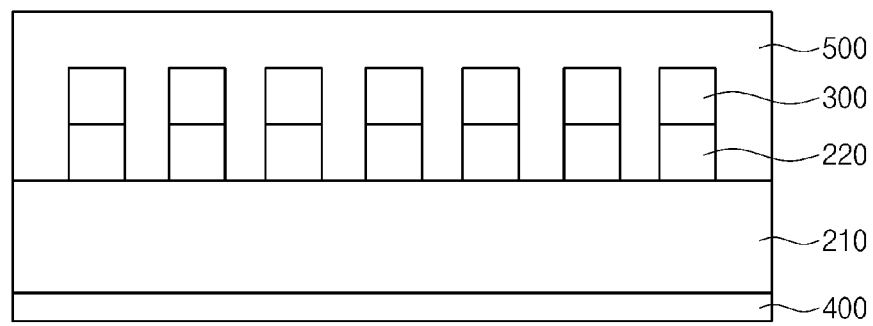
FIG. 1D is a cross-sectional view taken along a line II-II' of FIG. 1B.
Figure 1E:
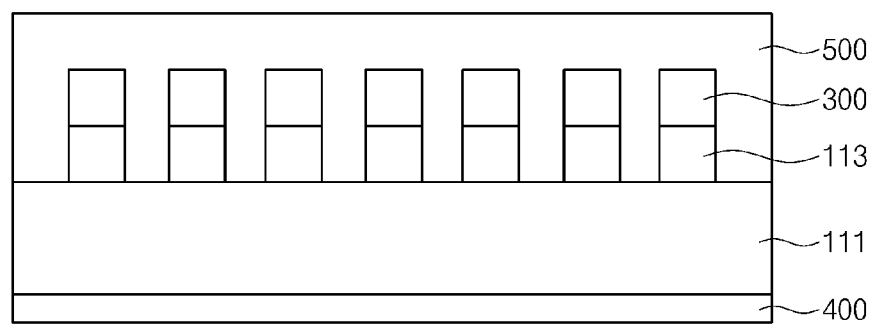
FIG. 1E is a cross-sectional view taken along a line of III-III' FIG. 1B.
Figure 1F:
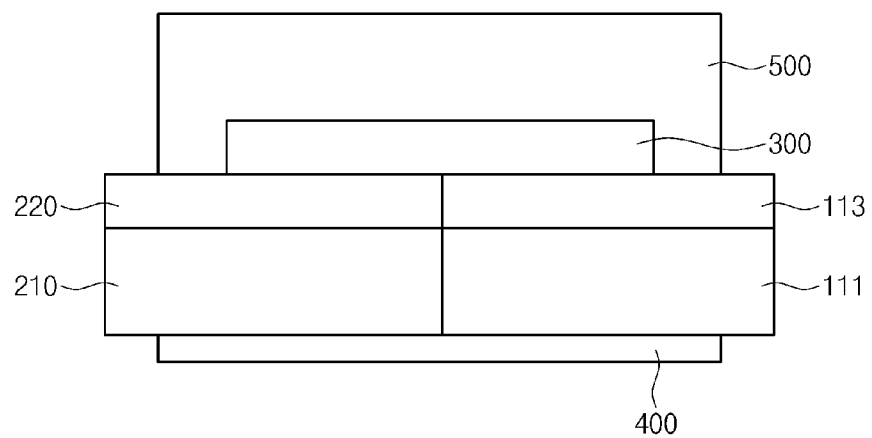
FIG. 1F is a cross-sectional view taken along a line IV-IV' of FIG. 1B.

FIG. 1A is a perspective view showing a display device according to an embodiment of the present invention, FIG. 1B is a plan view showing the display device shown in FIG. 1A, FIG. 1C is a cross-sectional view taken along a line I-I' of FIG. 1B, FIG. 1D is a cross-sectional view taken along a line II-II' of FIG. 1B, FIG. 1E is a cross-sectional view taken along a line III-III' of FIG. 1B, and FIG. 1F is a cross-sectional view taken along a line VI-VI' of FIG. 1B.

Referring to FIGS. 1A to 1F, a display device includes a display panel 100 that displays an image, a driving circuit 200 connected to the display panel 100 to apply an image signal to the display panel 100, and a connection terminal 300 that electrically connects the display panel 100 and the driving circuit 200.

The display panel 100 may be a self-emissive type display panel, such as an organic light emitting display panel, a plasma display panel, etc., or a non-self emissive type display panel, such as a liquid crystal display panel, an electrophoretic display panel, an electrowetting display panel, etc. In the embodiment of FIG. 1, as an example, the organic light emitting display panel will be described as the display panel 100.

The display panel 100 has a rectangular shape with long sides and short sides and is divided into a display area DA in which the image is displayed and a non-display area NDA surrounding the display area DA, in which the image is not displayed. In addition, the display panel 100 includes a display substrate 110 including a light emitting diode 112 and a sealer 120 isolating the light emitting device 110 from an external environment.

The display substrate 110 includes an insulating substrate 111, the light emitting diode 112 disposed in the display area DA of the insulating substrate 111, and an electrode terminal 113 disposed in the non-display area NDA of the insulating substrate 111.

The insulating substrate 111 includes a transparent insulating material. For instance, the insulating substrate 111 may be a rigid type substrate formed of glass or polymer like plastic. In the case that the insulating substrate 111 is a plastic substrate, the insulating substrate 111 may include polyethylene terephthalate (PET), polymethyl methacrylate, fiber reinforced plastic (FRP), or polyethylene naphthalate (PEN). In addition, the insulating substrate 100 may be a transparent flexible type insulating substrate.

The light emitting diode 112 includes a first electrode 112A disposed on the insulating substrate 111, a second electrode 112C facing the first electrode 112A, and an organic layer 112B disposed between the first electrode 112A and the second electrode 112C.

One of the first electrode 112A and the second electrode 112C is an anode and the other one of the first electrode 112A and the second electrode 112C is a cathode.

In addition, at least one of the first electrode 112A or the second electrode 112C may be a transmission-type electrode. For instance, when the display device is a rear surface light emitting type display device, the first electrode 112A is a transmission-type electrode and the second electrode 112C is a reflection-type electrode. In the embodiment of FIG. 1, the first electrode 112A may include a transparent conductive oxide, e.g., indium tin oxide (ITO), indium zinc oxide (IZO), aluminum zinc oxide (AZO), gallium-doped zinc oxide (GZO), zinc tin oxide (ZTO), gallium tin oxide (GTO), or fluorine-doped tin oxide (FTO). In addition, the second electrode 112C may reflect light and include at least one of Mo, MoW, Cr, Al, AlNd, or Al alloy.

When the display device is a front surface light emitting type display device, the first electrode 112A is a reflection-type electrode and the second electrode 112C is a transmission-type electrode. In addition, when the display device is a both surface light emitting type display device, both of the first and second electrodes 112A and 112C are transmission-type electrodes.

The organic layer 112B includes at least an emitting layer (EML) and has a multi-layer structure. The organic layer 112B includes a hole injection layer (HIL) that injects holes, a hole transport layer (HTL) that controls movement of the electrons to enhance an opportunity of recombination between the holes and electrons, the emitting layer that emits light according to the recombination between the holes and electrons, which are injected to the emitting layer, a hole blocking layer (HBL) that controls movement of the holes not recombined with the electrons, an electron transport layer (ETL) that transports the electrons to the emitting layer, and an electron injection layer (EIL) that injects the electrons.

The organic layer 112B includes a low molecular weight or high molecular weight organic material. The organic layer 112B may include copper phthalocyanine (CPC), N,N'-Di (naphthalene-1-yl)-,N'-diphenyl-benzidine (NPB), or tris-8-hydroxyquinoline aluminum (Alq3) as the low molecular weight organic material. In addition, the organic layer 112B may include poly-(2,4)-ethylene-dihydroxy thiophene (PEDOT) or polyaniline (PANT) as the high molecular weight organic material.

In addition, in the case that the high molecular weight organic material is used as the emitting layer of the organic layer 112B, the emitting layer may include one of poly(phenylene vinylene) (PPV), soluble poly(phenylene vinylene) (PPV), cyano-substituted poly(phenylene vinylene) (CN-PPV), or polyfluorene (PFO). The emitting layer may be a stack type or a tandem type. The stack type emitting layer is configured to include red, green, and blue sub-emitting layers, and a stack order of the red, green, and blue sub-emitting layers should not be limited to a specific order. In the stack type emitting layer and the tandem type emitting layer, all of the red, green, and blue sub-emitting layers is a fluorescent emitting layer or at least one sub-emitting layer is a phosphorescence emitting layer. In addition, emitting layers disposed at both sides of a charge generation layer of the tandem type emitting layer emit a white color light, a different color light, or a same color light, and the color light is a monochromatic or polychromatic light.

The electrode terminal 113 is disposed in the non-display area NDA of the insulating substrate 111 and extended in one direction. In addition, the electrode terminal 113 is electrically connected to the light emitting diode 112 and disposed on the same layer on which the light emitting diode 112 is disposed. That is, the electrode terminal 113 is extended along the one direction in the non-display area NDA and electrically connected to one of the first electrode 112A and the second electrode 112C. Accordingly, the electrode terminal 113 transfers the image signal provided from an external source (not shown) to the light emitting diode 112.

In addition, the electrode terminal 113 may include a conductive material. For instance, the electrode terminal 113 includes the same material, i.e., a transparent conductive oxide, as that of the first electrode 112A or the second electrode 112C. The transparent conducive oxide is at least one of ITO, IZO, AZO, GZO, ZTO, GTO, or FTO. In addition, the electrode terminal 113 may include a material having a high conductivity, e.g., gold, silver, copper, aluminum, etc.

The sealer 120 isolates the light emitting diode 112 from the external environment to prevent the light emitting diode 112 from being deteriorated due to moisture and oxygen. For example, the sealer 120 may be a sealing substrate disposed on the second electrode 112C or a sealing layer configured to include a plurality of insulating layers.

When the sealing substrate is used as the sealer 120, the sealer 120 is coupled with the display substrate 110 by using a sealant SP provided in the non-display area NDA.

The driving circuit 200 may be, but not limited to, a flexible circuit board on which driver ICs (not shown) are mounted. The driving circuit 200 includes a base film 210 and signal terminal 220 disposed on the base film 210 and connected to the driver ICs.

The base film 210 may be, but not limited to, an insulating film having flexibility. The base film 210 may include a polymer material with insulating property, such as polyimide, polyester, liquid crystal polymer, etc.

The signal terminal 220 is disposed adjacent to the electrode terminal 113 and extended in the same direction as the electrode terminal 113. The signal terminal 220 may include a metal material having a high conductivity, e.g., nickel, chromium, gold, silver, copper, aluminum, etc.

The connection terminal 300 is disposed on the electrode terminal 113 and the signal terminal 220 to electrically connect the electrode terminal 113 of the display panel 100 and the signal terminal 220 of the driver circuit 200. Accordingly, the connection terminal 300 applies the image signal from the signal terminal 220 to the electrode terminal 113.

The connection terminal 300 may include the same material as that of the first electrode 112A or the second electrode 112C. The connection terminal 300 includes a transparent conducive oxide, e.g., ITO, IZO, AZO, GZO, ZTO, GTO, or FTO. In addition, the connection terminal 300 may include a material having a high conductivity, e.g., gold, silver, copper, aluminum, etc.

The display device may further include a protective film 400 to prevent the driving circuit 200 from being separated from the display panel 100 and a cover 500 that covers the area in which the connection terminal 300 is formed to isolate the connection terminal 300 from the external environment.

The protective film 400 has a tape shape and includes one of polyimide (PI), polyethyleneterephthalate (PET), polycarbonate (PC), polyacrylate (PAR), and polyethylenenaphthalate (PEN).

The protective film 400 prevents a disconnection of the connection terminal 300 due to a separation between the display panel 100 and the driving circuit 200. The protective film 400 is attached to a surface opposite to a surface on which the electrode terminal 113 is mounted, of the display substrate 110 and to a surface opposite to a surface on which the signal terminal 220 is mounted, of the driving circuit 200, so that the protective film 400 prevents the display panel 100 and the driving circuit 200 from being separated from each other.

The cover 500 covers the connection terminal 300 and a portion of the electrode terminal 113 and the signal terminal 220, which are disposed at both sides of the connection terminal 300, so as to prevent the connection terminal 300 from being exposed to moisture or oxygen. In addition, the cover 500 includes a light-curing resin or a thermal-curing resin.

The electrode terminal 113 is connected to the signal terminal 220 by using the connection terminal 300. Accordingly, in embodiments of the display device, although a pitch of the electrode terminal 113 is reduced, the electrode terminal 113 may be prevented from being shorted to an adjacent electrode terminal thereto when compared to the case that the electrode terminal 113 is connected to the signal terminal 220 using an anisotropic conductive film (ACF).

Hereinafter, a method of manufacturing the display device will be described in detail with reference to 2A to 2C, and 3A to 3C.

Figure 2A:
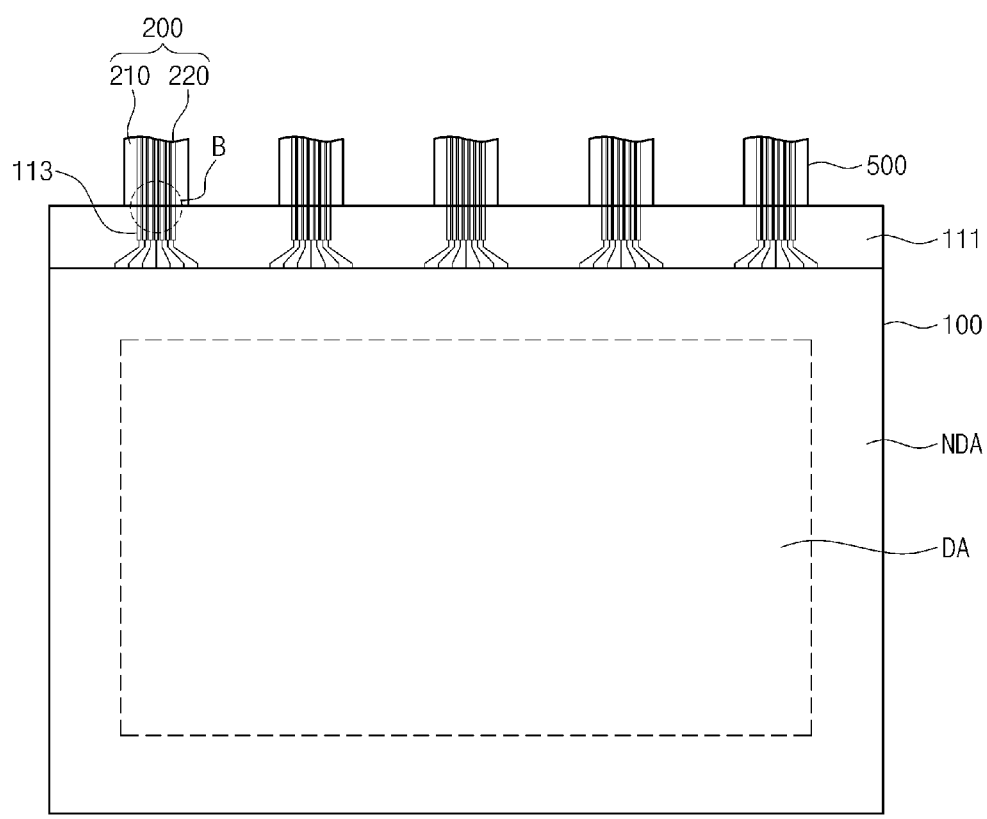
FIGS. 2A and 3A are plan views showing a method of manufacturing a display device according to an embodiment of the present invention.
Figure 2B:
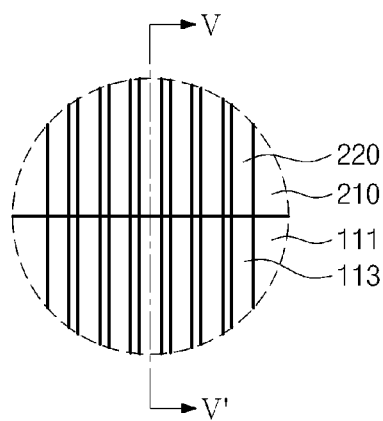
FIG. 2B is an enlarged view showing a portion B of FIG. 2A.
Figure 2C:
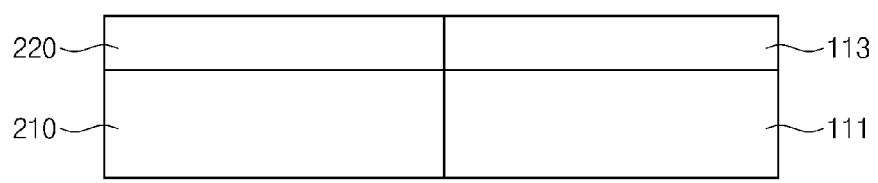
FIG. 2C is a cross-sectional view taken along a line V-V' of FIG. 2B.
Figure 3A:
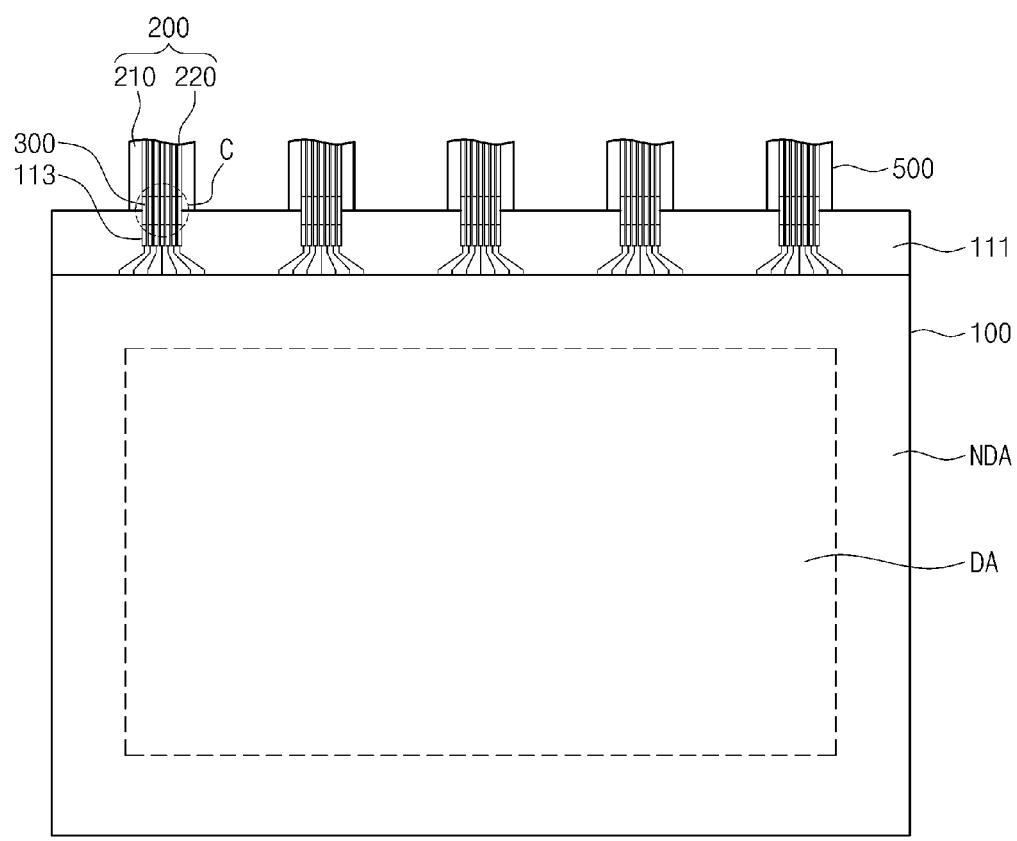
Figure 3B:
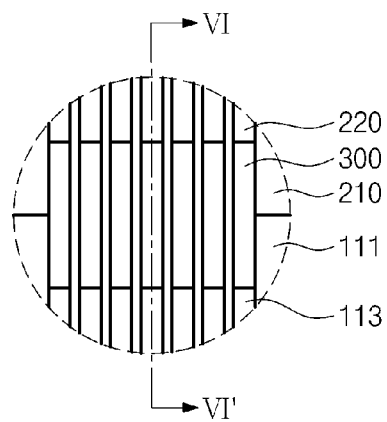
FIG. 3B is an enlarged view showing a portion C of FIG. 3A.
Figure 3C:
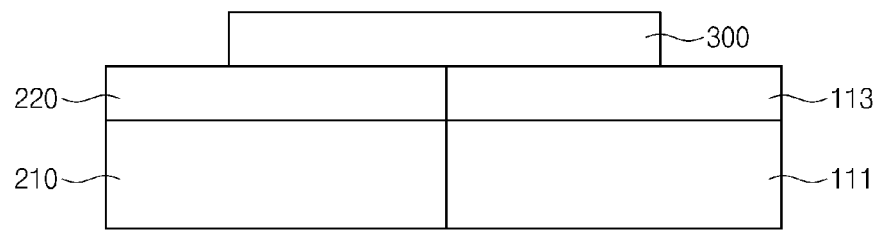
FIG. 3C is a cross-sectional view taken along a line VI-VI' of FIG. 3B.

FIGS. 2A and 3A are plan views showing a method of manufacturing a display device according to an embodiment of the present invention, FIG. 2B is an enlarged view showing a portion B of FIG. 2A, FIG. 2C is a cross-sectional view taken along a line V-V' of FIG. 2B, FIG. 3B is an enlarged view showing a portion C of FIG. 3A, and FIG. 3C is a cross-sectional view taken along a line VI-VI' of FIG. 3B.

Referring to FIGS. 2A to 2C, the display panel 100 is prepared.

The display panel 100 is divided into the display area DA and the non-display area NDA surrounding the display area DA. In addition, the display panel 100 includes the display substrate 110 including the light emitting diode 112 and the sealer 120 isolating the light emitting diode 112 from the external environment.

The display substrate 110 includes the insulating substrate 111, the light emitting diode 112 disposed in the display area DA of the insulating substrate 111, and the electrode terminal 113 disposed in the non-display area NDA of the insulating substrate 111.

The light emitting diode 112 includes the first electrode 112A disposed on the insulating substrate 111, the organic layer 112B disposed on the first electrode 112A, and the second electrode 112C disposed on the organic layer 112B. One of the first electrode 112A and the second electrode 112C is an anode and the other is a cathode. In addition, at least one of the first electrode 112A and the second electrode 112C is a transmission-type electrode.

The electrode terminal 113 is disposed in the non-display area NDA of the insulating substrate 111 and extended in one direction. The electrode terminal 113 is electrically connected to one of the first electrode 112A and the second electrode 112C. Accordingly, the electrode terminal 113 transfers the image signal provided from the external source (not shown) to the light emitting diode 112.

The sealer 120 isolates the light emitting diode 112 from the external environment to prevent the light emitting diode 112 from being deteriorated due to moisture and oxygen.

The driving circuit 200 is prepared after the display panel 100 is prepared. The driving circuit 200 includes the base film 210 and the signal terminal 220 disposed on the base film 210 and connected to the driver ICs.

After the driving circuit 200 is prepared, the driving circuit 200 is located such that the insulating substrate 111 and the base film 210 are adjacent and parallel to each other and the electrode terminal 113 and the signal terminal 220 are adjacent to each other and face the same direction.

Referring to FIGS. 3A to 3C, after the driving circuit 200 is located, the connection terminal 300 is formed to electrically connect the electrode terminal 113 and the signal terminal 220. In this case, the connection terminal 300 is formed by forming conductive ink pattern or conductive paste pattern on the electrode terminal 113 and the signal terminal 220 in the area in which the display panel 100 and the driving circuit 200 are adjacent to each other, using an inkjet print.

In addition, since the connection terminal 300 is disposed on the electrode terminal 113 and the signal terminal 220, which are extended in the same direction, the connection terminal 300 is disposed substantially in parallel to the electrode terminal 113 and the signal terminal 220. The connection terminal 300 is formed using the conductive ink or the conductive paste.

The conductive ink or the conductive paste is coated to overlap with the area in which the display panel 100 and the driving circuit 200 are adjacent to each other, so that a conductive layer is formed. In some embodiments, the conductive ink includes the transparent conductive oxide, e.g., at least one of ITO, IZO, AZO, GZO, ZTO, GTO, or FTO. In addition, the conductive paste includes at least one of gold, silver, copper, or aluminum and an adhesive.

Then, a photoresist pattern corresponding to the shape of the electrode terminal 113 and the signal terminal 220 is formed on the conductive layer.

When the conductive layer is patterned using the photoresist pattern as a mask, the connection terminal 300 disposed on the electrode terminal 113 and the signal terminal 220 is formed.

Referring back to FIGS. 1A to 1F, after the connection terminal 300 is formed, the protective film 400 is attached to a lower surface of the insulating substrate 111 and a lower surface of the base film 210 in the area in which the display panel 100 and the driving circuit 200 are adjacent to each other. The protective film 400 prevents the display panel 100 and the driving circuit 200 from being separated from each other, thereby preventing the disconnection of the connection terminal 113.

Then, the cover 500 is formed above the insulating substrate 111 and the base film 210 in the area in which the display panel 100 and the driving circuit 200 are adjacent to each other, so that the connection terminal 300 is isolated from the external environment. The cover 500 covers the connection terminal 300 and the portion of the electrode terminal 113 and the signal terminal 220, which are disposed at both sides of the connection terminal 300, to thereby prevent the connection terminal 300 from being exposed to moisture or oxygen. In addition, the cover 500 includes a light-curing resin or a thermal-curing resin.

The cover 500 is formed after the protective film 400 is attached, but it should not be limited thereto or thereby. That is, the protective film 400 may be attached after the cover 500 is formed.

Figure 4A:
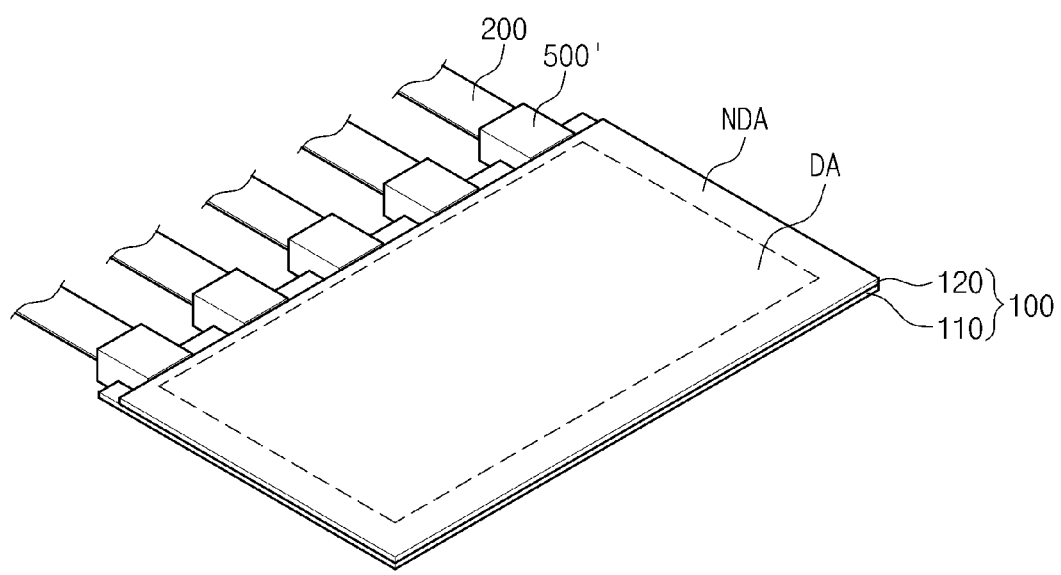
FIG. 4A is a perspective view showing a display device according to another embodiment of the present invention.
Figure 4B:
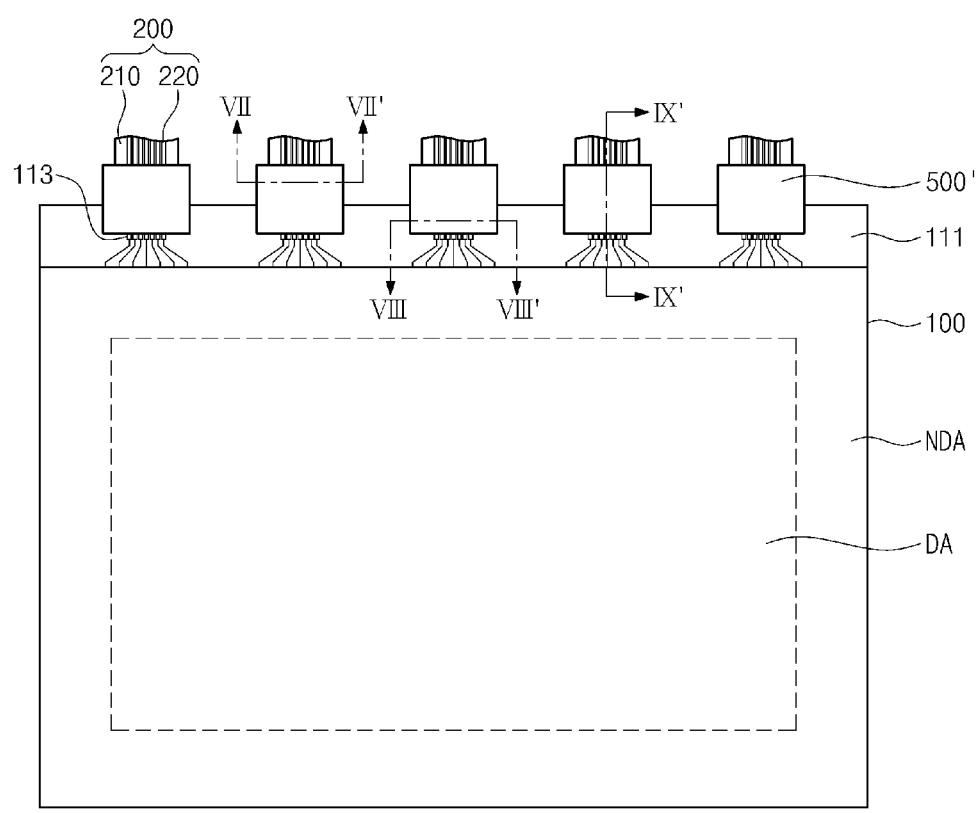
FIG. 4B is a plan view showing the display device shown in FIG. 4A.
Figure 4C:
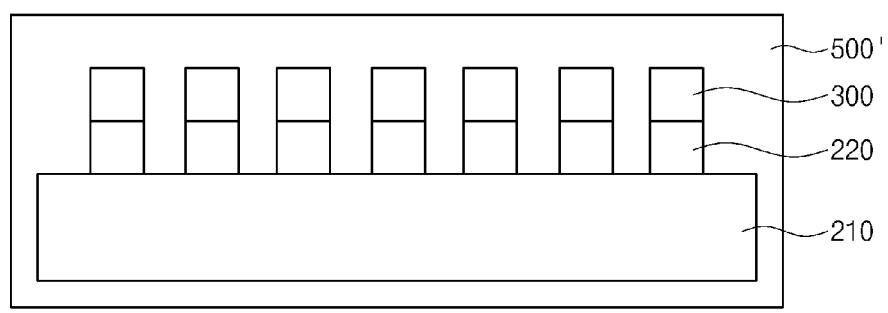
FIG. 4C is a cross-sectional view taken along a line VII-VII' of FIG. 4B.
Figure 4D:
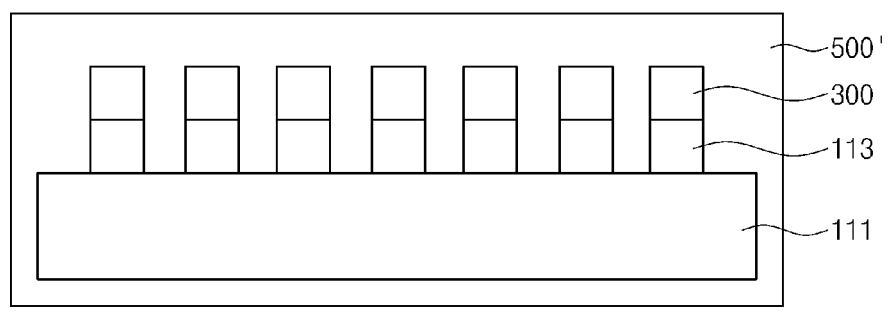
FIG. 4D is a cross-sectional view taken along a line VIII-VIII' of FIG. 4B.
Figure 4E:
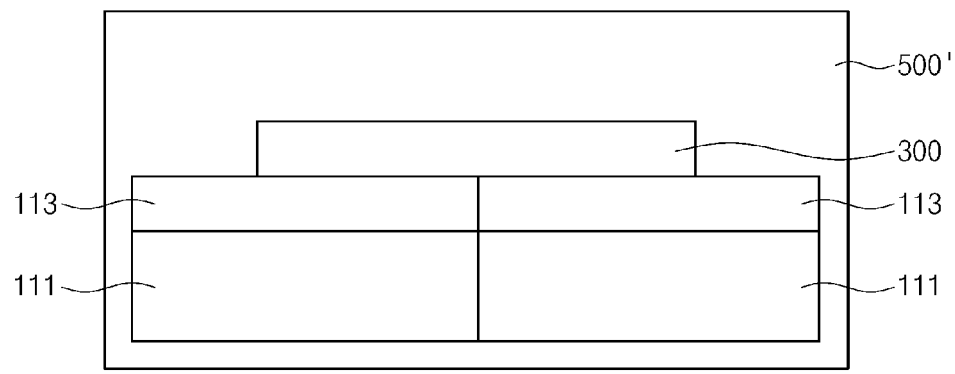
FIG. 4E is a cross-sectional view taken along a line IX-IX' of FIG. 4B.

FIG. 4A is a perspective view showing a display device according to another embodiment of the present invention, FIG. 4B is a plan view showing the display device shown in FIG. 4A, FIG. 4C is a cross-sectional view taken along a line VII-VII' of FIG. 4B, FIG. 4D is a cross-sectional view taken along a line VIII-VIII' of FIG. 4B, and FIG. 4E is a cross-sectional view taken along a line IX-IX' of FIG. 4B. In FIGS. 4A to 4E, the same reference numerals denote the same elements in FIGS. 1A to 1F, 2A to 2C, and 3A to 3C, and thus detailed descriptions of the same elements will be omitted.

Referring to FIGS. 4A to 4E, a display device includes a display panel 100 that displays an image, a driving circuit 200 connected to the display panel 100 to apply an image signal to the display panel 100, a connection terminal 300 that electrically connects the display panel 100 and the driving circuit 200, and a cover 500 that protects the connection terminal 300.

The display panel 100 is divided into a display area DA in which the image is displayed and a non-display area NDA surrounding the display area DA, in which the image is not displayed. In addition, the display panel 100 includes a display substrate 110 including a light emitting diode 112 and a sealer 120 isolating the light emitting diode 112 from an external environment.

The display substrate 110 includes an insulating substrate 111, the light emitting diode 112 disposed in the display area DA of the insulating substrate 111, and an electrode terminal 113 disposed in the non-display area NDA of the insulating substrate 111.

The driving circuit 200 includes a base film 210 and signal terminal 220 disposed on the base film 210 and connected to the driver ICs.

The connection terminal 300 is disposed on the electrode terminal 113 and the signal terminal 220 to electrically connect the electrode terminal 113 of the display panel 100 and the signal terminal 220 of the driver circuit 200.

The cover 500 covers the connection terminal 300 and a portion of the electrode terminal 113 and the signal terminal 220, which are disposed at both sides of the connection terminal 300, to thereby prevent the connection terminal 300 from being exposed to moisture or oxygen. The cover 500 covers upper and lower surfaces of the insulating substrate 111 and upper and lower surfaces of the base film 210 in the area in which the display panel 100 and the driving circuit 200 are adjacent to each other, and thus connection terminal 300 is isolated from the external environment.

Although some embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A display device comprising:
a display panel including a display area and a non-display area surrounding the display area, the display panel including an electrode terminal disposed in the non-display area and extended in a direction;
a driving circuit including a signal terminal extended in the direction of the electrode terminal and disposed adjacent to the electrode terminal, the driving circuit disposed at one side of the display panel; and
a connection terminal electrically connected to the electrode terminal and the signal terminal, the electrode terminal disposed on a surface of the connection terminal, the final terminal disposed on the surface of the connection terminal.

2. The display device of claim 1, wherein the connection terminal comprises at least one of indium tin oxide, indium zinc oxide, aluminum zinc oxide, gallium-doped zinc oxide, zinc tin oxide, gallium tin oxide, or fluorine-doped tin oxide.

3. The display device of claim 1, wherein the connection terminal comprises at least one of gold, silver, copper, or aluminum.

4. The display device of claim 1, wherein the display panel further includes:
a display substrate including an insulating substrate and a light emitting diode, wherein the light emitting diode is disposed on a surface of the insulating substrate; and
a sealer isolating the light emitting diode from an external environment,
wherein the electrode terminal is electrically connected to the light emitting diode and disposed on the surface of the insulating substrate on which the light emitting diode is disposed.

5. The display device of claim 4, wherein the driving circuit further includes a base film and the signal terminal is disposed on the base film.

6. The display device of claim 5, further comprising a protective film attached to a surface opposite to a surface on which the electrode terminal is mounted of the insulating substrate and to a surface opposite to a surface on which the signal terminal is mounted of the base film,
wherein the protective film prevents the connection terminal from being disconnected.

7. The display device of claim 6, further comprising a cover covering the connection terminal and a portion of the electrode terminal and the signal terminal, which are disposed at both sides of the connection terminal,
wherein the cover prevents the connection terminal from being exposed to moisture or oxygen in the external environment.

8. The display device of claim 7, wherein the cover comprises a light-curing resin or a thermal-curing resin.

9. A display device comprising:
a display panel including an insulating substrate, a light emitting diode disposed in a display area of the insulating substrate, and an electrode terminal disposed in a non-display area of the insulating substrate and extended in a direction;
a driving circuit including a base film and a signal terminal disposed on the base film, the signal terminal extended in the direction of the electrode terminal and disposed adjacent to the electrode terminal, the driving circuit disposed at one side of the display panel; and
a connection terminal electrically connected to the electrode terminal and the signal terminal, the electrode terminal disposed on a surface of the connection terminal, the final terminal disposed on the surface of the connection terminal.

10. The display device of claim 9, further comprising a protective film attached to a surface opposite to a surface on which the electrode terminal is mounted of the insulating substrate and to a surface opposite to a surface on which the signal terminal is mounted of the base film,
wherein the protective film prevents the connection terminal from being disconnected.

11. The display device of claim 10, further comprising a cover covering the connection terminal and a portion of the electrode terminal and the signal terminal, which are disposed at both sides of the connection terminal,
wherein the cover prevents the connection terminal from being exposed to moisture or oxygen.

12. The display device of claim 11, wherein the cover comprises a light-curing resin or a thermal-curing resin.

13. A method of manufacturing a display device, comprising:
preparing a display panel that includes an insulating substrate, a light emitting diode disposed in a display area of the insulating substrate, and an electrode terminal disposed in a non-display area of the insulating substrate and extended in a direction;
preparing a driving circuit that includes a base film and a signal terminal disposed on the base film, the signal terminal being extended in the direction of the electrode terminal and disposed adjacent to the electrode terminal, the driving circuit disposed at one side of the display panel; and
forming a connection terminal electrically connected to the electrode terminal and the signal terminal, the electrode terminal disposed on a surface of the connection terminal, the signal terminal disposed on the surface of the connection terminal.

14. The method of claim 13, wherein the connection terminal is formed by forming a conductive ink pattern or a conductive paste pattern on the electrode terminal and the signal terminal in an area in which the display panel and the driving circuit are adjacent to each other using an inkjet print.

15. The method of claim 14, wherein the conductive ink comprises at least one of indium tin oxide, indium zinc oxide, aluminum zinc oxide, gallium-doped zinc oxide, zinc tin oxide, gallium tin oxide, or fluorine-doped tin oxide.

16. The method of claim 14, wherein the conductive paste comprises at least one of gold, silver, copper, or aluminum and an adhesive.

17. The method of claim 13, wherein the forming of the connection terminal comprises:
coating a conductive ink or a conductive paste to overlap with an area in which the display panel and the driving circuit are adjacent to each other to form a conductive layer;
forming a photoresist pattern corresponding to a shape of the electrode terminal and the signal terminal on the conductive layer; and
patterning the conductive layer using the photoresist pattern as a mask.

18. The method of claim 13, further comprising attaching a protective film to a surface opposite to a surface on which the electrode terminal is mounted of the insulating substrate and to a surface opposite to a surface on which the signal terminal is mounted of the base film, to prevent the connection terminal from being disconnected.

19. The method of claim 13, further comprising forming a cover that covers the connection terminal and a portion of the electrode terminal and the signal terminal, which are disposed at both sides of the connection terminal, to prevent the connection terminal from being exposed to moisture or oxygen.

20. The method of claim 19, wherein the cover comprises a light-curing resin or a thermal-curing resin.

* * * * *

UNITED STATES PATENT AND TRADEMARK OFFICE
CERTIFICATE OF CORRECTION

| | | |
|---|---|---|
| PATENT NO. | : 8,988,403 B2 | Page 1 of 1 |
| APPLICATION NO. | : 13/834396 | |
| DATED | : March 24, 2015 | |
| INVENTOR(S) | : Choi et al. | |

It is certified that error appears in the above-identified patent and that said Letters Patent is hereby corrected as shown below:

In the specification

Column 3, line 11-12, please delete "of III-III'" and insert --III-III' of--, therefor.

In the claims

Column 9, line 66, claim 1 please delete "final" and insert --signal--, therefor.

Column 10, line 53, claim 9 please delete "final" and insert --signal--, therefor.

Signed and Sealed this
Sixteenth Day of February, 2016

Michelle K. Lee
*Director of the United States Patent and Trademark Office*